United States Patent [19]

Langdon, Jr. et al.

[11] 4,286,256
[45] Aug. 25, 1981

[54] METHOD AND MEANS FOR ARITHMETIC CODING UTILIZING A REDUCED NUMBER OF OPERATIONS

[75] Inventors: Glen G. Langdon, Jr., San Jose; Jorma J. Rissanen, Los Gatos, both of Calif.

[73] Assignee: International Business Machines Corporation, Armonk, N.Y.

[21] Appl. No.: 98,285

[22] Filed: Nov. 28, 1979

[51] Int. Cl.$^3$ ............................................. H03K 13/24
[52] U.S. Cl. ............................................. 340/347 DD
[58] Field of Search ................. 340/347 DD; 235/310; 358/260, 261

[56] References Cited

U.S. PATENT DOCUMENTS 4,122,440  10/1978  Langdon ....................... 340/347 DD

OTHER PUBLICATIONS

Rissanan "IBM Journal of Research and Development" pp. 198-203, May 1976.
Pasco "Source Coding Algorithms for Fast Data Compression" Doctoral Thesis, Stanford Univ., May 1976.
Preuss "Conf. Rec., 1975 IEEE Int. Conf. on Commun." vol. 1 Jun. 16-18, 1975, pp. 7-12-7-16.
Donnan "IBM Systems Journal" vol. 13, No. 2, pp. 140-162, 1974.

Primary Examiner—Charles D. Miller
Attorney, Agent, or Firm—R. Bruce Brodie

[57] ABSTRACT

A method and means of arithmetic coding of conditional binary sources permitting instantaneous decoding and minimizing the number of encoding operations per iteration. A single shift and subtract operation for each encoding cycle can be achieved if an integer valued parameter representative of a probability interval embracing each source symbol relative frequency is used for string encoding and control. If the symbol being encoded is the *most probable*, then nothing is added to the arithmetic code string. However, an internal variable is updated by replacing it with an augend amount. If the updated internal variable has a leading zero, then both it and the code string are shifted left by one position. If the symbol being encoded is the *least probable*, then a computed augend is added to the code string and the code string is shifted by an amount equal to the integer valued parameter.

11 Claims, 8 Drawing Figures

SYSTEM DIAGRAM

SYSTEM DIAGRAM

A TRANSMITTER INCLUDING A BINARY ENCODING ELEMENT

BINARY ENCODER ELEMENT

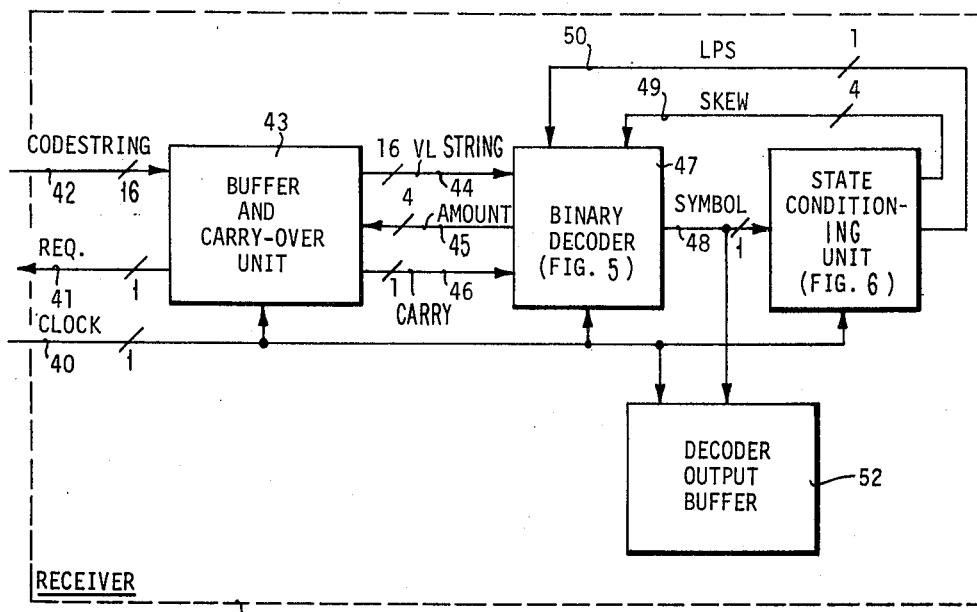
FIG.4 RECEIVER INCLUDING A BINARY DECODER AND CLOCKING
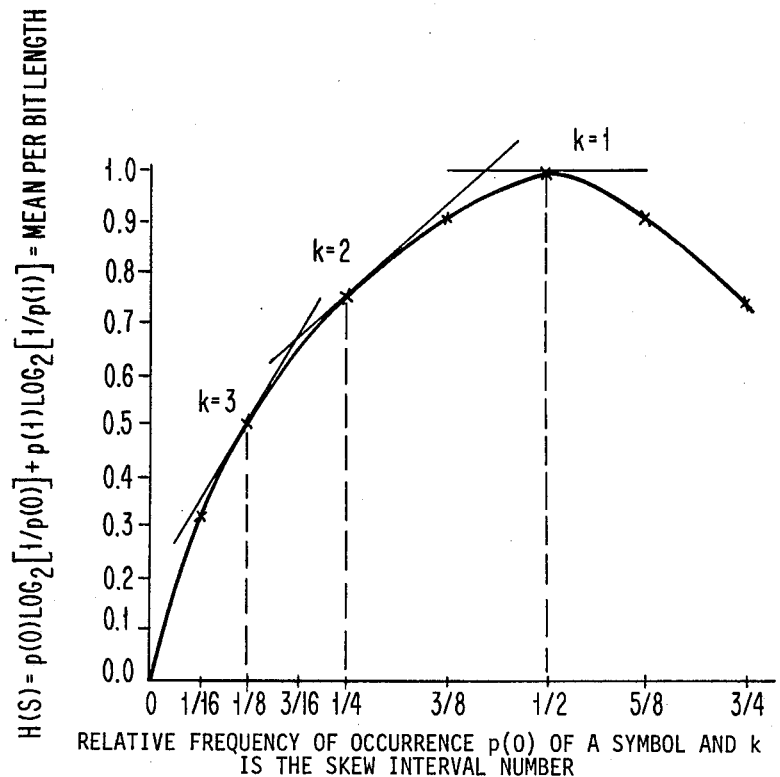
FIG.8 ENTROPY CURVE AND SKEW INTERVALS

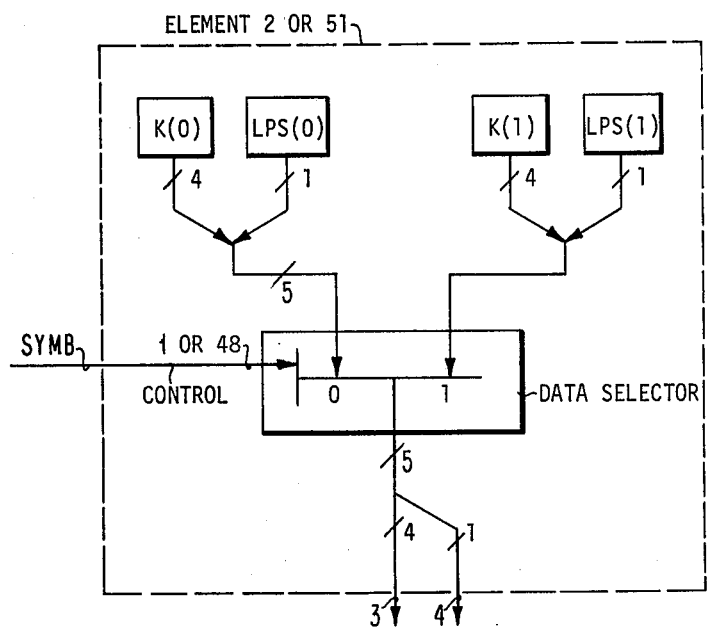
FIG. 6 FIRST ORDER MARKER TYPE STATE CONDITIONING UNIT
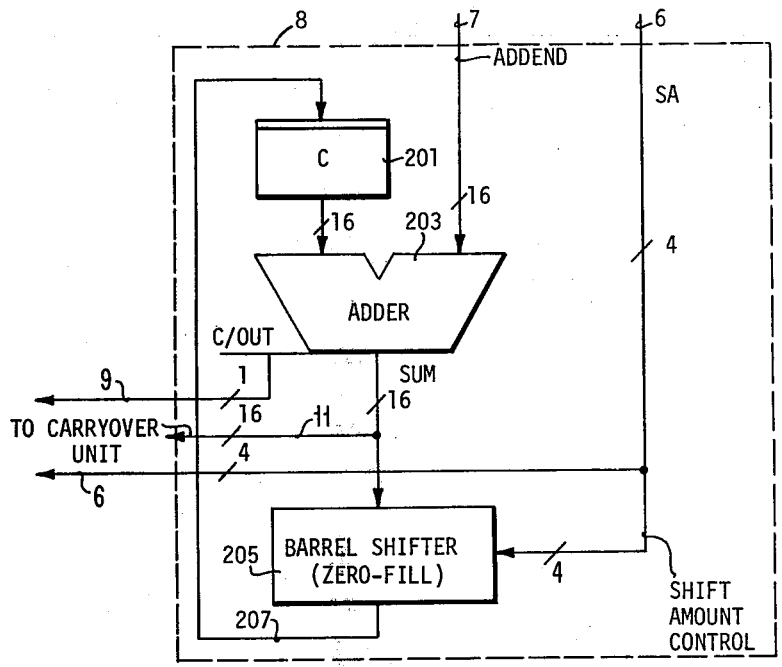
FIG. 7 ADD-AND-SHIFT UNIT

METHOD AND MEANS FOR ARITHMETIC CODING UTILIZING A REDUCED NUMBER OF OPERATIONS

TECHNICAL FIELD

This invention relates to the compression/decompression of binary sources involving arithmetic coding of the shift and add type. More particularly, the invention relates to the compacting of symbol strings from conditional binary sources utilizing a parameter relatable to counterpart predetermined source alphabet probability intervals in order to drive a Rissanen/Langdon FIFO type arithmetic encoder.

BACKGROUND

Because the invention seeks to improve the operation of a particular class of string encoder as well as perfect a match to a conditional binary symbol source, prior art bearing on both aspects is believed pertinent. In the following paragraphs reference is made first to LIFO/FIFO arithmetic coding and then to one prior method of source (state) encoder conditioning in order to couple the encoder to a statistical symbol source.

Arithmetic coding was introduced by Rissanen, "Generalized Kraft Inequality and Arithmetic Coding", IMB Journal of Research and Development, Volume 20, Number 3, May 1976, at pages 198–203. In this regard, arithmetic coding is a method applicable to source encoding for purposes of data compression. The source alphabet can be of any size. However, the basic coding operation is add and shift, rather than concatenate and shift. The quantity added to the code strings is called an "augend" and is always a fixed number of bits long. The "shift amount" is a function of the symbol probability. The decoder decodes each symbol by magnitude comparison. Thus, the code string is treated as a magnitude which, for decoder convenience, can be set to lie in the range between zero and one. When the decoder determines the value of the symbol, it subtracts out the augend corresponding to that symbol. The decoder then shifts the result left by the corresponding shift amount.

Langdon, et al, U.S. Pat. No. 4,122,440, "Method and Means for Arithmetic String Coding", issued Oct. 24, 1978, taught that arithmetically encoded strings could be compressed to an efficiency approximating, within a predetermined amount, the entropy. The advance in this case relied on using only a limited amount of information from the last code word generated in order to calculate the new code word. Consequently, a compressor/decompressor became physically realizable because a buffer of only finite length was required. Applications were restricted because of the manner by which the code characters were generated, i.e., shifting to the right. This resulted in LIFO decoding. LIFO decoding means that the least significant bits are generated first, while the most significant bits are generated last. Consequently, decoding cannot occur until the entire code string has been received and/or assembled. In FIFO operations, the most significant bits are generated first and hence, decoding can occur without delay.

One example of FIFO string encoding is to be found in R. C. Pasco, "Source Coding Algorithms for Fast Data Compression", doctoral thesis, Department of Electrical Engineering, Stanford University, May 1976. In this thesis, Pasco disclosed a method of arithmetic coding in which the updating of the encoded string uses the multiplication operation performed upon operands selected according to their relative probabilities of symbol occurrence. Pasco's use of multiplication for updating required that for each m bit operand multiplied by an n bit operand, then m+n bits of precision would have had to be maintained. Although FIFO decoding was possible, it required the processing of the entire string prior to transmission and/or storage. The reason for this was that Pasco did not control his "carry".

The arithmetic encoding process can be viewed as the summation of properly shifted numbers as may be found, for example, in the process of ordinary multiplication, where individual summands are the augends and the displacements in digits between adjacent augends are the shift amounts. In this regard, see the Langdon, et al, patent and Rissanen and Langdon, "Arithmetic Coding", IBM Journal of Research and Development, Volume 23, Number 2, pages 149–162, March 1979.

We formulate an analogy of encoding with ordinary multiplication. In ordinary multiplication, some augends may be zero, as in arithmetic coding, but the shift amount is always one. Also, in ordinary multiplication, as in LIFO-type arithmetic codes, each augend is added to the sum of the previous right-most augend. In ordinary multiplication, this is called a partial product. For arithmetic coding purposes, it is termed a partial sum.

In ordinary multiplication, once bit positions have exited to the right of the arithmetic part of the summation operation, they are never changed. In LIFO arithmetic codes, the summation begins at the least significant augend, whereas for the FIFO codes, the summation begins with the most significant augend. For FIFO codes, the carry-over presents a problem because the partial sums are generated beginning with the most significant augend. This is because bit positions which have already undergone the summation process are still subject to being "one-upped" due to the propagation of a carry.

The "carry-over problem" with respect to FIFO arithmetic codes may be understood by way of an encoder at the working end of a code string outputting a string of consecutive ones, then a "one" added to the lowest order "one" would cause a carry to propagate left until stopped by a zero. Copending U.S. Patent application U.S. Ser. No. 048,318 filed June 14, 1979, "A Method and Means for Carry-over Control in the High Order to Low Order Pairwise Combining of Digits of a Decodable Set of Relatively Shifted Finite Number Strings", Langdon and Rissanen, described FIFO code string generation requiring only the insertion of a control character after the detection of a run of consecutive "ones" in the code string. This control character insertion caused the decoder to be operated in an overflow mode. The key was in the invocation of the decoder to share overflow (carry propagation management) and not place the entire burden upon the encoding cycle.

The success of coding a source alphabet for the purpose of compression depends upon the source statistics, i.e., the individual symbol probabilities of the source. Ideally, a compression code uses shorter code words from the code alphabet for the more probable source symbols and longer code words for the less probable symbols. Ideally, short code words should be assignable to all source symbols. However, in order to decode such an encoded string, a binary code alphabet can only have two code words of length one, i.e., zero or one. Indeed, if zero and one are used as single code words, then there is no room for longer code words and still have the code uniquely decodable. As a result, when the source is binary there have been attempts in the art to encode "events" which represent a group of source symbols at a time. The simplest example of this is alphabet extension, where 0 0, 0 1, 1 0, and 1 1 may be treated as a four-symbol alphabet. Another example of increasing the number of events to be encoded is called run-length coding. The repetition factor of the most probable symbol is encoded.

A source conditioning function maps the past history of the source into a set of conditioning states. Source conditioning is application dependent and is part of the prior art of code design. In a simple example, the "first order" Markov source takes as the current state, the value of the last symbol emitted from the source. In two-dimensional black and white facsimile coding, the state used by Preuss is a previously transmitted neighborhood of the pel to be encoded. Preuss' teaching appeared in the 1975 conference record IEEE on Communications, Volume One, June 16–18, at pages 7/12-7/16, "Comparison of Two Dimensional Facsimile Coding Schemes".

Preuss pointed out that with a four-picture element neighborhood, with each pel being zero (white) or one (black), there are $2^4$, or 16 states. Each state n has conditional probabilities p(0/n) and p(1/n) for the encoded pel being respectively white or black. As is well known, integer length code word codes for binary sources assigned code word "0" to symbol zero and "1" to symbol one, resulting in no compression. To avoid this problem, Preuss constructed individual runs (strings of consecutive zeros or consecutive ones) for each state appearance. The appearances themselves were not, in general, consecutive. Consequently, for each such state, the runs were accumulated during a document scan. After scanning, an associated encoder transmitted the run-lengths for the first state, second state, etc. Since the state did not appear in this order, the decoder was required to receive the entire transmission and then reconstruct the documents from the run-length. Again, the method is not instantaneous as the decoder must receive at least most of the encoded document before it can start to decode.

THE INVENTION

It is accordingly an object of this invention to devise a method and means of arithmetic coding of conditional binary sources, permitting instantaneous decoding and minimizing the number of encoding operations per iteration. It is a related object that the encoding/decoding time per symbol be uniform.

The above objects are satisfied by an embodiment which limits the augend computation action to a single shift and subtract operation per encoding cycle. This is a substantial reduction from two multiply operations per iteration as required by the aforementioned Pasco system. This reduction is attained by constraining the values of the conditional binary probabilities. The arithmetic code string is generated in a manner so as to permit instantaneous decoding. This is obtained by controlling carry propagation utilizing the teaching of the copending Rissanen, et al, application. That is, the arithmetic code string represents the source as a binary number in high-to-low order with the insertion of a control character in the string after a predetermined run of consecutive carrys (one's).

In this invention, it was unexpectedly observed that a single shift and subtract operation per each encoding cycle could be achieved, if an integer valued parameter k representative of a probability interval embracing each source symbol relative frequency were used for string encoding control.

More particularly stated, the invention is included in an apparatus for generating an instantaneous FIFO binary arithmetic code string C(sb) recursively formed by the high-to-low order pairwise combining of digits of a decodable set of relatively shifted finite binary number strings C(s) and augend A(sb). This is in response to each binary symbol b in the symbol string s. In this latter regard, "q" of the lowest order bits of each string are combined during each recursion. Further, as mentioned, arithmetic code string carries are controlled through control character insertions after predetermined length runs of consecutive ones.

Letting B denote the value of the more probable symbol (MPS), and B' the value of the less probable symbol (LPS), the improvement comprises a first and second register means for storing respectively at least "q" of the lowest order bits of C(s) (the working end) and a fractional binary q-bit number T(s). T(s) is a recursion variable. The improvement further comprises first means responsive to each applied symbol b for obtaining an integer valued parameter k indicative of the symbol position's relative frequency second means for forming either A(sB') or T(sB) by right shifting the second register contents by k positions and subtracting the shifted contents $T(s)2^{-k}$ from the unshifted second register contents. This yields $$T(sB) \text{ or } A(sB') = T(s)[1-2^{-k}]$$

and constitutes the single shift and subtract operation per encoding cycle. The remaining operation involves combining the augend with the code string and left shifting by an amount conditioned by the augend amount; the parameter k, the contents of a predetermined register bit position, and the symbol value. That is, the improvement further comprises third means for forming a code string shift amount either of magnitude k when b is the less probable symbol or of a second magnitude according to the value in a designated bit position (msb) in the second register; and forth means responsive to the shift amount and A(sb) for combining A(sb) with C(s) in the first register to form C(sb) and for left shifting the first register contents according to the shift amount.

Restated, if the symbol b being encoded is B (not the LPS), nothing is added to the code string C(s). However, the q-bit internal variable T is updated by replacing it with the value $$T(sB) = A = T \times (1-2^{-k}).$$

The value is truncated to q bits. Also, if the new T has a leading 0, then both T and the code string are shifted left one bit. T is always "normalized". If the symbol b being encoded is B' (the LPS), then the same value $$A(sB') = A = T \times (1-2^{-k})$$

is added to the code string C(s) and the code string C(sb) is shifted left k bits. The initial value for T is 0.11 ... 1(q 1's), treated as a fraction.

It is yet another aspect of this invention to include a receiver having decoding means for decoding the symbols in the same order as the encoder encoded them. The decoder keeps "in step" with the encoder position at each symbol, basically discovering whether or not the encoder could have added the value $$TA = "T \times (1 - 2^{-k})"$$

(called the Trial Augend, or TA) to the code string at that position. The initial value of internal variable T is 0.11 . . . 1 as for the encoder.

The decoder begins working on the q left-most bits of the code string C. A buffer unit keeps the decoder supplied with more code string bits as needed. Using the values of the so far reconstructed "history", the symbols are evaluated and the conditioning state value is obtained. With the state value, the skew table is accessed for the LPS value B' and skew number k. The value of TA is calculated and subtracted from the properly aligned code string value C. If the result is positive, the symbol encoded was indeed the LPS B' and (C−TA) is shifted left k bits to form the new aligned code string. Internal variable T remains the same. If C−TA is negative, then TA could not have been added by the encoder and the pel encoded was not LPS. Internal variable T is replaced by TA if the most significant bit is "1". Otherwise, T is normalized by shifting it left one bit, and C is also shifted left one bit, the decoded bit is placed in a Markov state element, and becomes a part of the history string used for state conditioning.

It is an advantage that the receiver provide one decoded bit per cycle at a steady rate. It is yet another advantage that the state conditioning part is separate from the receiver. All the receiver needs is the value k and LPS. If a different model is needed, only the state conditioning need be changed.

The invention may further be appreciated with reference to the previously described state encoding. In this regard, the encoding technique for binary conditional sources does not require the interlacing of run-length code words as does Preuss. In contrast, near entropy compression factors are achieved and the decoding is instantaneous. Advantageously, the method and means of the invention are practicable for a large number of states. It is a feature of this invention that it can accommodate each state n by storing two items, i.e., LPS(n) and k(n). These respectively denote a one-bit number representing the least probable symbol (LPS) for that state and the skew number k indicating a range of probabilities within which lies p(LPS/n).

BRIEF DESCRIPTION OF THE DRAWING

FIG. 4 sets out the gross receiver logic including the binary decoder and clocking.

FIG. 6 illustrates the first order Markov-type state conditioning element interacting with both the binary encoding/decoding elements shown in FIGS. 1, 2 and 4.

FIG. 7 is an exemplary add and shift unit referenced in FIG. 2 code string manipulator.

FIG. 8 is a graph of entropy versus relative frequency of occurence, including skew intervals k.

DESCRIPTION OF THE BEST MODE AND INDUSTRIAL APPLICABILITY

Figure 1:
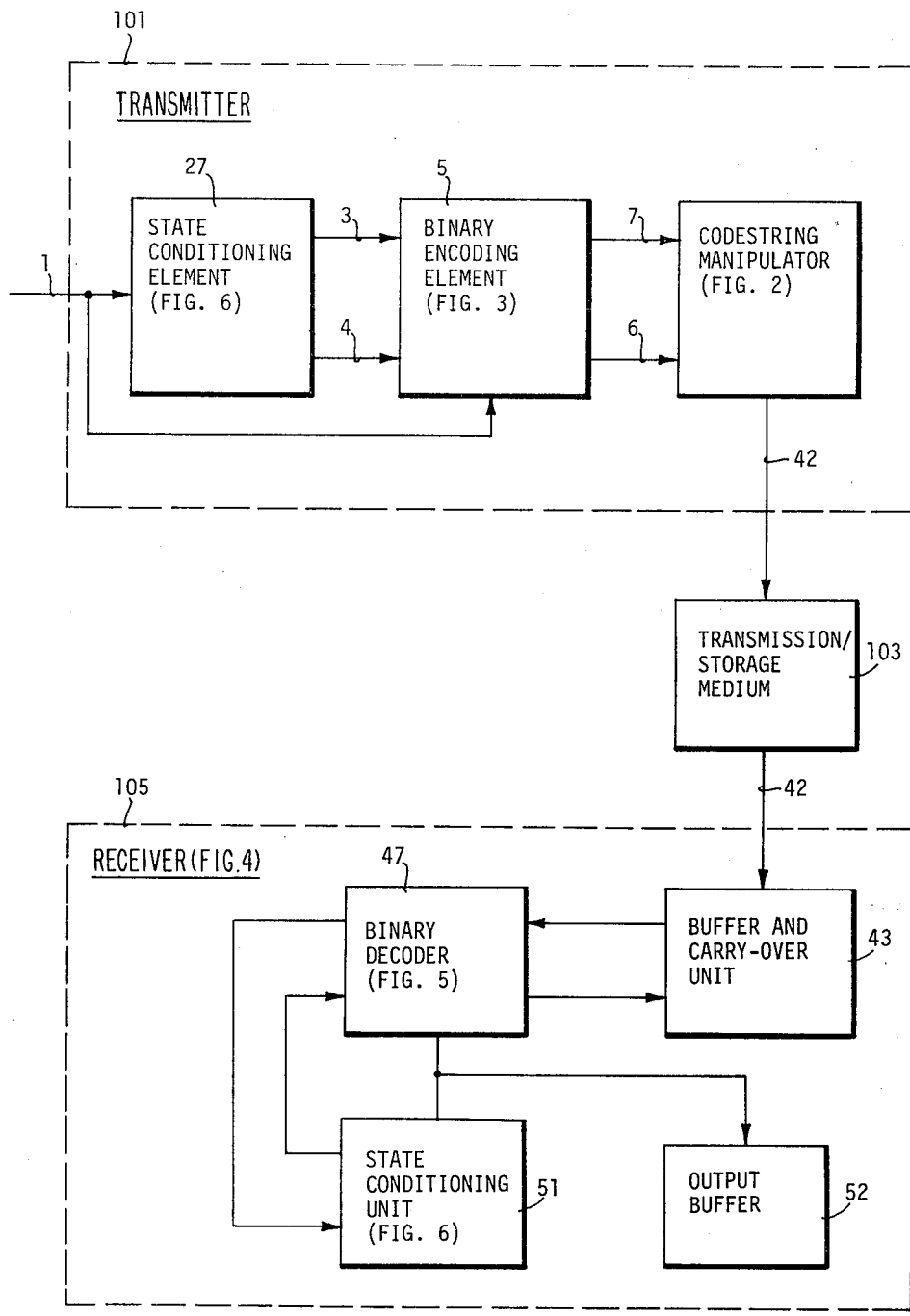
FIG. 1 is a system data flow diagram depicting a transmitter and receiver incorporating the arithmetic coding invention.

Referring now to FIG. 1, there is shown a transmitter 101 and a receiver 105 intercoupled by a transmission/storage medium 103. Source symbols b are applied to transmitter 101 over path 1, and a succession of arithmetic string encoded elements is moved from a code string manipulator to the transmission/storage medium over path 42 and from said medium to the receiver 105. Both the arithmetic encoding and decoding at the respective transmitter and receiver may be considered as sequential state machines. They include a state conditioning element 27 and encoding element 5 for the encoder. Likewise, a state conditioning element 51 and decoder 47 perform the counterpart inverse function in the receiver. The detailed logic of an exemplary state conditioning element is shown in FIG. 6, while the code string manipulator, binary encoding element and binary decoder, are shown respectively in FIGS. 3, 2 and 5.

The preferred embodiment of the present invention involves the implementation of arithmetic coding operations in the special case of binary alphabets. These call for the determination of augends and shift amounts. In order to facilitate the system description, the functions of code string manipulation are described in the ensuing paragraphs.

Referring again to FIG. 1, the transmitter is fed with a series of source symbols. These are encoded by the complex of state conditioning element 27 and binary encoding element 5 to provide the code string manipulator 107 with the augend and shift amount for each source symbol. The manipulator accepts the augend and shift amount and provides the necessary addition and shifting operations implied by arithmetic coding, buffers the working end of the code string, and handles the carry-over problem. The serialized arithmetic string code may be stored or transmitted. At the receiver 105 this string is buffered, any consequences of the carry-over problem are resolved and the working end of the code string is applied to the decoder 47 at its own pace. The decoding element 47 and 51 in turn regenerate the original input string of source symbols and apply them to output buffer 52.

For each new source symbol b and old source string s, the encoding elements determine an augend A(sb) and shift amount of y(sb) bits. The augend A(sb) is added to C(s) to form the new code string C(sb). Next, the new code string C(s) is shifted left by y(sb) bits. In this (FIFO) case, the working end of the code string is the least significant end. In FIFO encoding/decoding, a carry-out from the sum of the augend and the least significant end of the code string may cause a carry-out propagation to travel in the direction of the most significant end of the code string, so long as a stretch of one-bits exists. This is what is meant by the carry-over problem of the FIFO case.

Compression schemes take into account the relative frequency of symbols of the source alphabet. In the case of this instant invention the source alphabet is binary. Letting symbols 0 and 1 denote the source alphabet, and p(0) and p(1) denote their respective probabilities for source S, the per-bit entropy H(s) relative to the binary (two-valued) code alphabet is:

$$H(s) = p(0)\log_2[1/p(0)] + p(1)\log_2[1/p(1)].$$

The per-bit entropy is a lower-bound on the per-bit length of a code string encoded from source F, each occurrence of symbol 0 contributing $l'(0) = \log_2[1/p(0)]$ to the code string length and each occurrence of symbol "1" contributing $l'(1) = \log_2[1/p(1)]$ to the code string length. Since this represents the best which can be done for source S, $l'(0)$ and $l'(1)$, as defined, are the ideal lengths for the source. In practice, the lengths are not achievable. In a shift and add arithmetic coding scheme, each time the code string is shifted out, its length is increased by that amount. Thus, the amount of code string shift corresponding to each source symbol should be related to its ideal length.

Referring now to FIG. 8, there is shown a graph of the entropy H(S) as a function of the relative frequency of occurrence p(0). Superimposed on the per-bit entropy curve is a series of straight line segments. Each straight line segment represents the mean per-bit code string length which would result from using length pairs $l_k(0)$ and $l_k(1)$ over each indicated skew interval k. For a binary source S, if $p(0) = p(1) = 0.5$, then $H(s) = 1$ and no compression is achievable. The greater the skew, the greater the compression and the smaller the mean per bit-length H. Illustratively, in the subsequent description of the preferred embodiment, it will be assumed that symbol 0 is the most popular symbol B (MPS), i.e., $p(0) \geq 0.5$.

It should be noted that the term "skew" is motivated by the fact that if $p(0) = p(1) = 0.5$, then $H(s) = 1$ constitutes "no skew", while the odds of one thousand to one are "more skewed" than odds of one hundred to one. Skew interval $k = 1$ is for no skew and for $k \geq 2$ corresponds to $p(1) = 2^{-k}$ (odds of $2^k$ to 1).

When $p(0) \geq 0.5$, then $l'(0) < 1$. This poses the problem of treating fractional code string shift. Intuitively, if $l'(0) = \frac{1}{4}$, then every fourth occurrence of symbol 0 would cause the length of the code string to be increased by one bit. A cardinal thought is that a fractional shift can be "owed" to the code string and accumulated. When the accumulated fractional shift "x" owed becomes greater than 1, then the code string can be shifted one bit.

A right or left shift of a binary string of l bits as a multiplication by $2^{-l}$ or $2^l$ respectively, then the concept can be extended to the fractional values x. Let $0 < x < 1$, then a multiplication by $2^{-x}$ represents a right fractional shift of x bits, while a multiplication by $2^x$ represents a left fractional shift of x bits. To accumulate fraction part $x_1$ and $x_2$, they are simply added. The fractional portion of a shift "owed" the code string can be represented as a fractional length which becomes an exponent of 2. This motivates the term "length approach", since the fractional repart is remembered as a length.

Alternatively, consider a length l. There is associated therewith a probability $p(l) = 2^{-l}$. Therefore, a right shift of the code string by length l corresponds to a multiplication by p(l). One can view the number of leading zeros p(l) as an integer number of bits of shift, with the fractional part being the bits following the leading one. When the fractional part is remembered as a multiplication factor, this is termed the "multiplier approach" to remembering the fractional bit position. This approach to fractional bit position location was first employed by Pasco in his thesis. In the length approach where fractional lengths are summed, there is no problem with precision of the result since the number of fractional bits remains the same. In the multiplier approach, the bits of precision of a product is the sum of the bits of precision of the factors. In Pasco's system only a fixed number of product precision bits were retained by way of truncation of the result.

In the relation $p(l) = 2^{-l}$, if l is rational, then p(l) is irrational. In the general case, implementations of arithmetic codes represent ways to "approximate" the irrational element of the ideal probability-length pair. In the multiplier approach of this invention, the logarithm of the inverse probability is taken as a rational number. Significantly, the retained fraction part T (the amount owed the code string) is an internal state of the encoder. The output of the encoder is not only a function of the input symbol, but also of its own internal state T.

Arithmetic coding is characterized by a double recursion, successively performed for each symbol of the input string. In this regard, let C(s) denote the code string of bits obtained by successively encoding source string s, $s = b_0 b_1 b_2 \ldots b_i$ where each subscripted symbol b is a value from the source alphabet. Corresponding to each symbol i there is a positive probability p(i). These source probabilities p(b) are employed in the encoding and decoding process. Another value derived from the source probabilities is the cumulative probability P(b) defined as sum ordering of the probabilities of the source symbols preceding b in the alphabet. The cumulative probability P(i) may be defined as the sum of the source probabilities of symbols preceding i in the alphabet symbol ordering. Thus, in binary source alphabet $P(0) = 0$ and $P(1) = p(0)$ in the following description of the preferred embodiment p(0), p(1), P(0), and P(1) are represented as q-bit binary fractions, where q may be, for example, 16.

Other notational conventions include C(s) as the old code string following encoding string s, while C(sb) is the new code string following the encoding of symbol b. Also, A(sb) is the augend resulting from encoding symbol b with the encoder in the present internal state resulting from encoding the previous input string s. Likewise, the present internal state is denoted T(s) when the encoder is operating concurrently on symbol b. This results in the next internal state T(sb).

Where a value such as T(b) also depends on the skew parameter k, the skew parameter appears as a subscript, i.e., $P_k(b)$ or $l_k(b)$ in the general case the same value of symbol b may be the least popular (LPS) or the most popular (MPS) symbol. Thus, notations $l_k(LPS)$ indicates the length parameter of the least probable symbol for skew parameter k. For a binary alphabet of 0 and 1 and given that the p(LPS) and p(MPS) are known, then the parameter k may be selected such that $2^{-k} \approx p(LPS)$.

As previously mentioned, in the general case the encoding of each symbol b is subject to a double recursion, the equations representing these operations are:

$$C(sb) = C(s) + T(s) \times P(b) \tag{1}$$

$$T(sb) = T(s) \times p(b) \tag{2}.$$

The product $T(s) \times P(b) = $ scaled augend A(s,b) which is added to the old code string. T(s) is a scale factor growing progressively smaller. The prior art vis-a-vis Pasco converted the factor T(s) into a floating point number such that:

$$T(s) = t(s) \times 2^{-Y(s)} \quad (3)$$

$$0.1 \leq t(s) < 1.0 \quad (4)$$

where t(s) is a fractional part (mantissa) and Y(s) is a non-negative integer. Consequently, the augends A(sb) now becomes $$A(sb) = t(s) \times P_k(b) \quad (5).$$

Equations (1) and (2) may be rewritten as follows:

$$C(sb) = C(s) + A(s,b) = 2^{Y(s)} \quad (1')$$

$$t(sb) = t(s) \times P_k(b) \times 2^{y(sb)} \quad (2'a)$$

$$Y(sb) = Y(s) + y(sb) \quad (2'b)$$

Significantly, equation 2 has been modified to I make explicit the normalization process. In equations (2'a) and (2'b), y(sb) is chosen to uniquely satisfy equation (4) for t(sb). In fact, the value of y(sb) is the number of zeros following the radix point for the unnormalized product $t(s) \times p_k(b)$.

It should be noted that equations 5 and 2' require two multiplications, i.e., $t(s) \times p_k(b)$ and $t(s) \times P_k(b)$. It was unexpectedly observed that one of the multiply operations could be avoided. This is achieved by noting that $t(s) \times p_k(b) = t(s) \times [1 - P_k(b)]$. When b=0, then $P_k(0) = 0$. Thus, the multiplication $P_k(b) \times t(s)$ is always required. When b=1, then $P_k(b) \times t(s)$ is required in the form of $P_k(1) \times t(s)$. However, $t(s) \times p_k(1)$ is also necessary. This is acquired by subtraction:

$$t(s) \times p_k(1) = t(s) - [t(s) \times p_k(0)] \quad (6)$$

The critical portion of the observation is that in a special case, two multiplications are reducible to a single shift and subtract operation through a binary subtractor. This is done by a special selection of the values p(0) and p(1) as design parameters. In this regard, the probability parameter for the LPS is taken in the form of $2^{-k}$, while that for the MPS is taken in the form of $1-2^{-k}$. For convenience, it may be assumed that $P_k(0) \geq P_k(1)$. Significantly, the equations involving the multiplications for each of the two possible values for source symbol b can be expressed as follows:

| b = 0 | | |
|---|---|---|
| From equation (5) | A(sb) = t(s) × 0 | (7) |
| From equation (2'a) | t(sb) = t(s) × [1-2$^{-k}$] truncated | (8) |
| | y(sb) = number of leading zero's of t(sb) | |
| b = 1 | | |
| | A(sb) = t(s) × [1-2$^{-k}$] truncated to q bits | (9) |
| | t(sb) = t(s) | (10) |
| | y(sb) = k | |

Equation (7) is trivial, while (10) is no more than a right shift of t(s) by k bits. Equations (8) and (9) are identical. They also involve a right shift of t(s) by k bits as well as a subtraction operation. Consequently, independent of the value of the source bit b, the basic encoding operation only requires that t(s) be right-shifted k bits, subtracted, with the result being truncated to q bits.

Thus, multiplication is replaced by a single shift and a subtraction. For purposes of completeness, it should be appreciated that for the case of k=1, that equations (7), (8), (9), and (10) also hold with the multiplier of t(s) set to $2^{-1}$. This latter amounts to a right shift of one-bit position.

Next, consider the context for the encoder. The task of encoding for compression of binary strings is to accept a binary string $$s = b(1), b(2), b(3), \ldots, b(i), \ldots b(n),$$

where, b(i) is a source symbol of 0 or 1, and for generating a code string C(s). The code string should be decodable in the FIFO manner; that is, letting b(o) be the first symbol encoded, than b(o) should be the first symbol decoded, etc.

Figure 2:
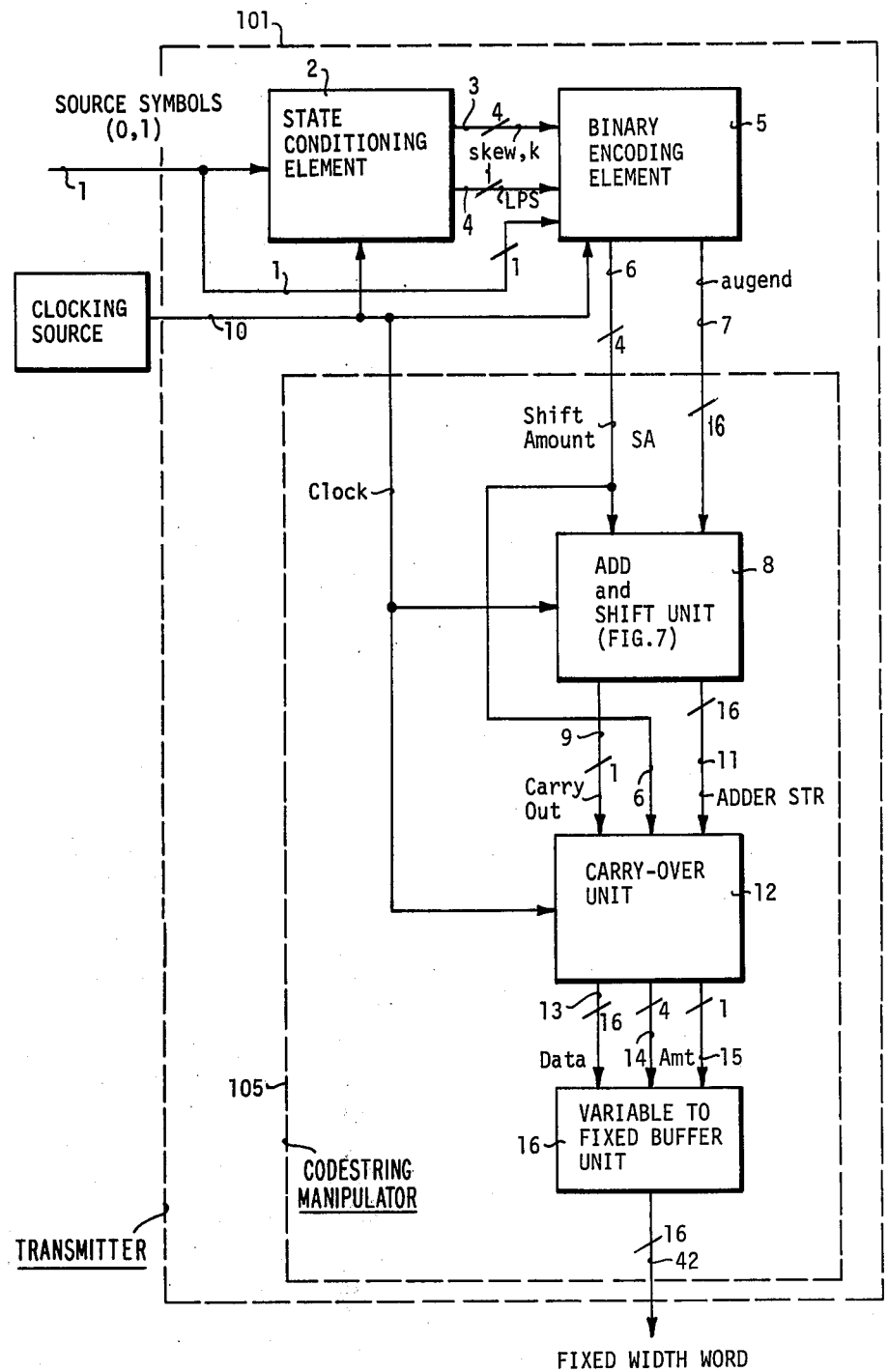
FIG. 2 shows the transmitter with the block logic features of the code string manipulator element of FIG. 1.

Referring now to FIG. 2, there is shown a transmitter 101 including a binary encoder element 5. The source symbols of 0 or 1 appear successively at one per clock cycle on line 1. The input source symbol stream is fed to the state conditioning element 2 and the binary encoding element 5 over a single-bit wide path. Depending upon the past history of the source symbol string, the coding parameter k on path 3 and LPS on path 4 are both applied to the encoder element 5. The function of the encoder element is to produce a shift amount SA on path 6 and an AUGEND on path 7 for application to an add and shift unit 8. The add and shift unit "adds" the value of the augends from path 7 to the "working end" or right-hand least significant end of the code string. The add and shift unit then shifts the code string by the required amount SA.

Because the addition process can generate a high-order carry-out, this must be managed. Carry-over unit 12 receives information regarding the carry on path 9, the shift amount on path 6 and the high-order end of the adder string on path 11. Parenthetically, the control and data flow of carry-over unit 12 is described in copending U.S. Patent Application U.S. Ser. No. 048,318, filed June 14, 1979, in the name of Langdon and Rissanen.

The activities of the state conditioning unit 2, encoder element 5, add and shift unit 8 and carry-over unit 12 are synchronized by a central timing pulse source 10, labeled CLOCK. In view of the fact that the output of the carry-over unit 12 may be variable length data, it is desired to smooth out the transfer by applying it to a variable to fixed length buffer unit 16. The buffer output comprises a succession of fixed width words shown here as a 16-bit wide path.

While the buffer is not the object of this invention and any number of serial-to-parallel or parallel-to-serial networks may be used, a preferred form could comprise a shifting network modified to append variable length substrings to a fixed length substring; an adder for tracking the length of the fixed length string relative to the next variable length string; and a length register for accepting bits by the buffer to a predetermined amount prior to its being filled up to said predetermined amount. In this regard, the adder and the length register control the amount of shift by the network.

Figure 3:
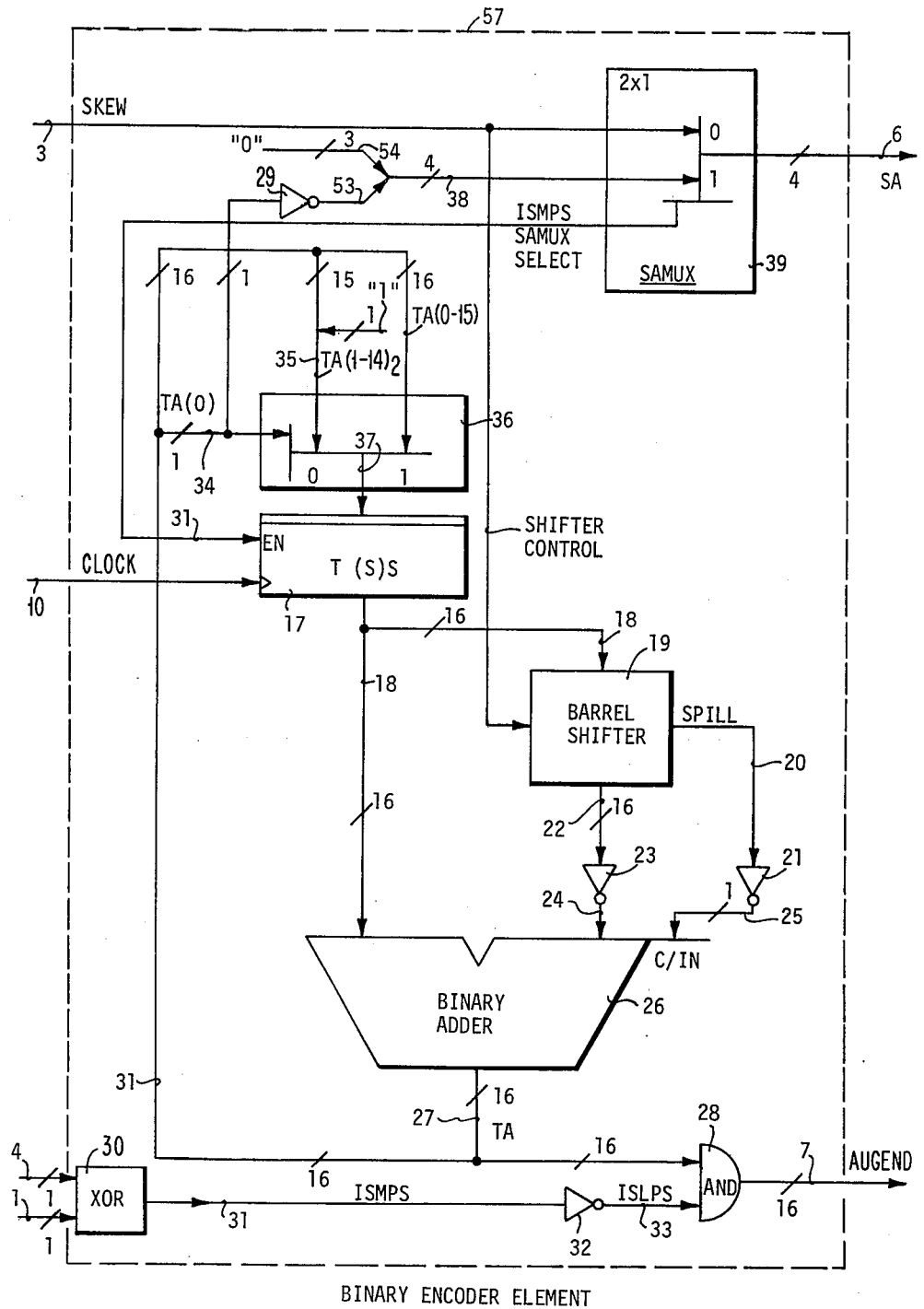
FIG. 3 depicts the detailed logic of the binary encoder element of FIGS. 1 and 2.

Referring now to FIG. 3, there is shown the details of binary encoder element 5. The inputs include clock 10, the four-bit wide value k (skew) on path 3, the bit indication of the least probable symbol on one-bit wide path 4 and the value of the bit to be encoded on path 1. Exclusive-OR gate 30 determines whether the LPS or MPS is to be encoded. If LPS is "1" and the symbol is "0", or if LPS is "0" and the symbol is "1", then the symbol is the MPS and a logical complemented signal is passed simultaneously over path 31 through inverter 32 and into multiplexer 39. The augend calculation begins with the value in the retained fraction register T(s) 17. This register value is simultaneously applied over path 18 as one 16-bit input to binary adder 26 and as a 16-bit parallel input to parallel shifter 19. Note that a barrel switch design may be of a form described by R. F. Lim, "A Barrel Switch Design", Computer Design, August 1972, pages 76–79; or as set forth by R. L. Davis, "Uniform Shift Networks", Computer, September 1974, pages 60–71.

The barrel shifter 19 shifts right through positions 1 to 15 as controlled by the value k applied to path 3. The shifter 19 output is called "spill" and is a one-bit signal. It is inverted on path 20 and applied as a carry input to binary adder 26. The output on path 20 is active and consists of a "1" if a one-bit was shifted off to the right. Otherwise, if all lost bits were "0", the value of path 20 is zero. The signal on path 20 is complemented by inverter gate 21 and applied as a carry input on line 25 to the adder 26. The 16-bit shifted output of shifter 19 is complemented by inverter gate 23 and applied to the right input of adder 26. The effect of the complementation of shifter 19 output is to generate a "1's complement" of the 16-bit shifted value in T. The result of the binary addition is the "trial augend" and appears on path 27. The value on path 27 is the truncated product T times $(1-2^{-k})$, k being the value of the number on path 3. Note, the truncation is to 16 bits and this is achieved through the complementation of spill 20 signal applied to C/IN. This technique of truncation saves time over the alternative of forming a double-length result and truncating afterwards. While the result of adder output 26 is being computed, the signal on path 31 "ISMPS" is generated from exclusive OR 30 and complemented by inverter 32 creating the signal "ISLPS" 33.

Let us step back a moment and review the encoder rules and trace through a simplified encoding operation.

SUMMARY OF ENCODER RULES

1. If b(i)="0" (most probable symbol)
   (a) Augend=0
   (b) $T=T\times(1-2^{-k})$ truncated.
   (c) If T(0)=0; normalize T (shift T left one bit). (T(0) is most significant bit of T.)
   (d) C is unchanged unless T is normalized, where C is shifted left.
2. If b(i)="1" (least probable symbol)
   (a) Augend=$T\times(1-2^{-k})$ truncated.
   (b) $C=(C+\text{Augend})\times(2^{-k})$ (After adding, shift C left k bits).
   (c) T is unchanged.

Referring again to FIG. 3, together with the summary of the encoder rule, if register 17 holds the retained fraction part, then for the first symbol to be encoded its register contents are 0.11111111. In the simple case, $T\times(1-2^{-k})$ is formed by feeding T to the left binary adder input 26 over path 18 and $T\times2^{-k}$ to the subtrahend input 24 by way of barrel shifter 19 over path 22 and inverter 23. The magnitude of k on path 3 determines the amount of right shift by shifter 19. In this regard, for a right shift by 1,2,3 places corresponds respectively to a k of 0,1,2. Note that the 2's complement subtraction may be accomplished by inverting the subtrahend through inverter 23 and adding it to the "minuend" applied to the left-hand input of the binary adder 26 over path 18. A fourth carry-in is applied through inverter 21 on path 25. Note that the LPS and input signal values are compared by exclusive OR GATE 30 to determine which symbol either LPS or MPS is to be encoded. As a result of the comparison, either signal ISMPS or ISLPS will be valid. The value $T\times2^{-k}$ is the augend only if ISLPS is valid, otherwise the augend is 0. This is accomplished by q AND GATES.

If ISLPS is "1", then the symbol to be encoded is LPS. Signal ISLPS 33 is applied to AND GATE 28 which passes a value on bus 27 to the augend output path 7. As mentioned, AND GATE 28 is replicated sixteen times, once for each bit. When LPS is 1, i.e., ISMPS is 0, then ISMPS 31, MUX 39 will select and connect path 3 and place the skew amount k on the output path 6. Also, observe that register 17 is edge-triggered and has an enable input EN, which is set by a 1 on path 31. If the EN input 31 is "1", when the active transition on CLOCK 10 occurs, then the value at the register 17 input will be stored. On the other hand, if the input EN is "0", then the CLOCK transition on CLOCK 10 is ignored and register 17 does not change its contents. The T register EN signal is the complement of ISLPS.

If the signal ISLPS on path 33 is 0, then a 0 is applied to all 16 AND GATES 28 and the 16-bit bus 7 has passed therethrough the value 0. If indeed the symbol to be encoded is most probable, then "0" is the correct augend value. Further, the normalized value on path 27 is either T itself if bit T(0) is "1", or the normalized value is the value TA left-shifted one bit if T(0) is "0". The original value T(0) is a "1" and the shift and subtract action which develops can do no more than halve the value of T, so a single left shift is sufficient for normalization. Normalization is accomplished by TMUX 36 whose select control signal is TA(0) on path 34. As mentioned, when TA(0) is a "1", no normalization is required. On the other hand, if TMUX select control TA(0) is a "0", the other multiplexer input 35 is gated to the input path 37 to register 17. The shift amount output on path 6 is developed through MUX 39 as controlled by signal ISMPS 31, which in the current case is a "1". The path 6 output value is the value on the 4-bit bus 38 whose least significant bit 53 is the complement of TA(0) 34 as generated by inverter 29. When the shift is due to normalization, the three most significant bits are "0" from bus 54. The shift amount is therefore "0" if normalization is not needed for TA. The shift amount is 1 if normalization requires TA to be left-shifted one bit before being stored in register 17. These may be restated in the following manner.

If the symbol applied to the binary encoder 5 is LPS, the shift amount is the same value as that on path 3. This value is gated via MUX 39 as shown. Also, T need not be updated so that the CLOCK pulse controlling a new value for T may be inhibited.

On the other hand, if MPS is the value of the symbol being applied to encoder 5, the shift amount corresponds to the number of zeros (0 or 1) preceding the leading "1" of $T\times(1-2^{-k})$. This is determined by examining TA(0). This function is conveniently accomplished by means of TMUX 36, which either passes $$T\times(1-2^{-k})$$

or left-shifts it one bit in order to normalize it before saving it in the T register (register 17).

---

Encoder Example $k = 2, p(0) = \frac{3}{4}, p(1) = \frac{1}{4}, s = 10001.$
keep 4 bits of precision. Initial T = .1111 b(1)
    2a. Augend = (.1111 × .11) = .1011.
    2b. C = .1011 × (2*2) = 10.1100.
    2c. T = .1111. (unchanged)

b(2)
    1a. Augend = 0
    1b. T = .1111 × .11 = .1011. (Note truncation was performed.)
    1c. C = 10.1100 (unchanged)

b(3)
    1a. Augend = 0.
    1b. T = .1011 × .11 = .1000.
    1d. C = 10.1100 b(4)
    1a. Augend = 0.
    1b. T = 0110.
    1c. T = .1100. (normalized)
    1d. C = 101.1000 (Shifted left one bit.)

b(5)
    2a. Augend = .1100 × .11 = .1001.
    2b. C = (101.1000 + .1001) × (2*2) = 11000.0100.

---

End of String:

The "end effect" is the fraction to right of decimal point.

Drop the right-most zeros, code string C=1100001.

Referring now to FIG. 4, there is shown the environment in which the decoder 47 operates. The buffer and carry-over unit 43 receives its code string input C(s) on path 42 in fixed width form. This is shown here as 16 bits in width. If the carry-over was handled by control character insertion as previously mentioned, carry-over unit 43 would remove the control character and restore the code string. This could require the activation of input carry line 46 to the binary decoder unit 47. The next substring the decoder unit requires is presented left justified on path 44 denominated VL string. If carry 46 is active, it signifies that "1" must have been added to the lowest order position of the "working end" of a code string before concatenating to the right the relevant bits of VL string 44. The "working end" of code string C(s) is located in decoder 47. The carry-over unit 43 maintains the values presented to the decoder until, at the end of a cycle, it receives a non-zero value on path 45. Upon receipt of the non-zero value, carry-over unit 43 shifts and left justifies the new value on VL string. The value for carry 46 is recalculated. If at the end of any CLOCK cycle, the value on path 45 is 0, then the carry-over unit 43 maintains the previous value on paths 44 and 46.

Decoder unit 47 receives input skew value k on path 49 and the LPS bit from state conditioning 51 over path 50. On decoding the next symbol, the decoded output is presented over path 48 to decoder output buffer 52 at the rate of one bit per CLOCK cycle. Each decoded bit symbol is simultaneously applied to state conditioning element 51 so that the proper values of k and LPS can be applied to control lines 49 and 50. When the symbol has been decoded, it is also known what the shift amount was. This value can then be place on path 45 before the end of a CLOCK cycle. If necessary, the carry-over unit 43 can place the next substring of the code string on path 44 and the value for the carry on path 46. When the carry-over unit requires another 16-bit word from the code string, it activates a request signal to the medium 103 over path 41. The units of the receiver operate in synchronism as controlled by CLOCK 40. Each deactivation of CLOCK 40 initiates a new CLOCK cycle. Before describing the behavior of decoder 47 reference is first made to a summary of decoder rules.

Summary of Decoder Rules

1. Construct test Augend $TA = T \times (1 - 2^{-k})$ truncated.
2. If TA > C (that is, if (C−TA) < 0):
    (a) b(i)=0 (most probable symbol).
    (b) If TA(0)=1, T=TA, and C is unchanged.
    (c) If TA(0)=0, T=TA×2. (Normalize T.)
    (d) If TA(0)=0, C=C×2. (Pass on normalization to C.)
3. If TA=C or TA < C:
    (a) b(i)=1 (least probable symbol).
    (b) $C = (C - TA) \times (2^k)$.
    (c) T is unchanged.

At the beginning of each cycle, decoder 47 receives state conditioning information and decodes a source symbol b(i) and applies it to output line 48 responsive to the information on paths 44, 46, 49, and 50. This is achieved at the end of the decode cycle. Concurrently, the decoder has determined the length of the code string it has just processed and deleted. This value is communicated to the buffer and carry-over unit 43 over path 45.

Figure 5:
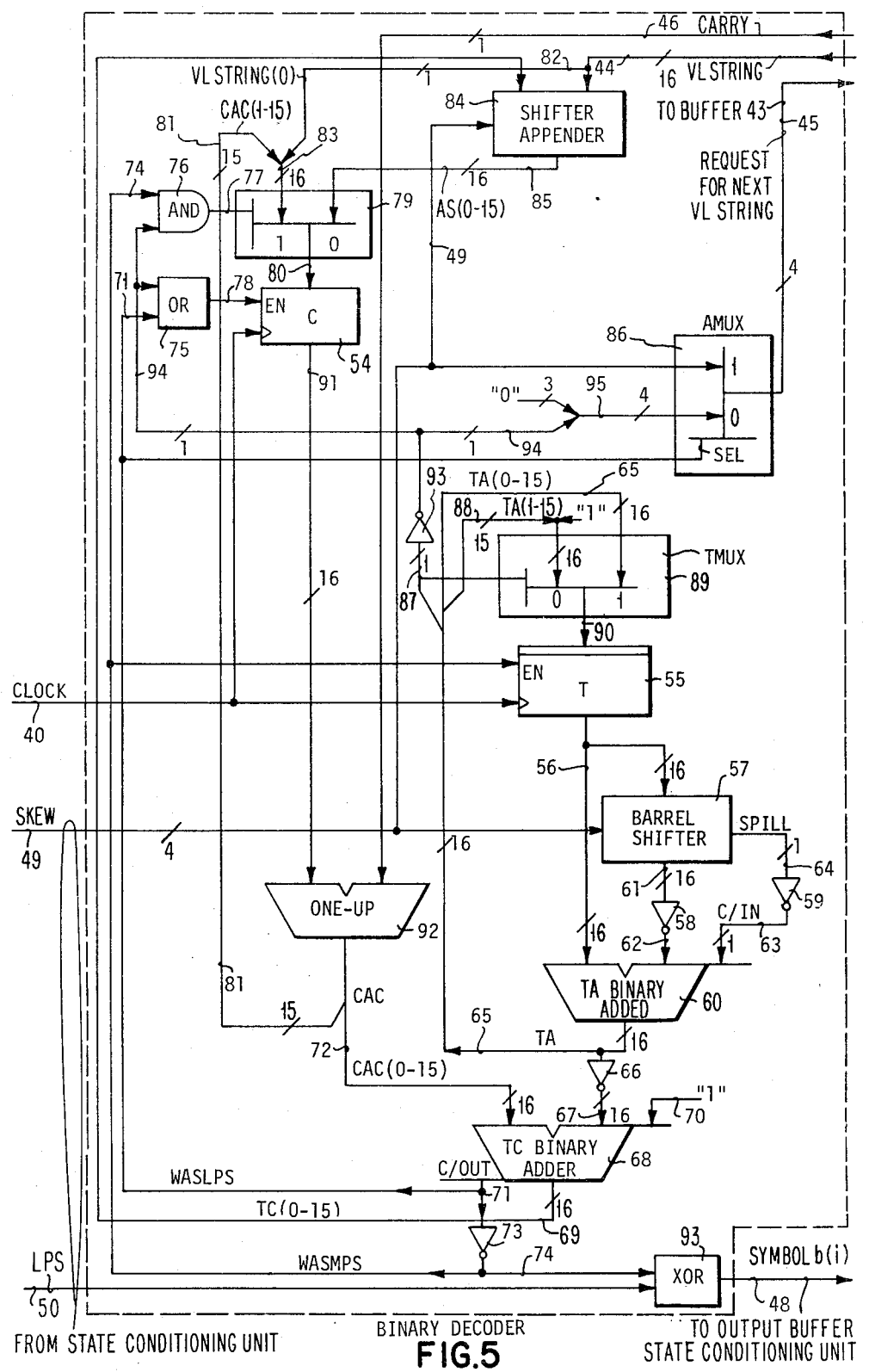
FIG. 5 shows the binary decoder detailed logic of FIGS. 1 and 4.

Referring now to FIG. 5, there is shown the detailed logic of the binary decoder 47. The function of the decoder is to reconstruct the binary source string $$s = b(1) \; b(2) \; b(3) \ldots b(i) \ldots b(n)$$

which was encoded to C(s) in the FIFO manner by the encoder. To decode b(1), the decoder begins with the initial value for T, which is 0.111 . . . 1(sixteen ones). From T and the skew value k the decoder generates the trial augend TA. TA is the augend which would have been added to the code string had LPS been encoded. If C(s) is less than TA, then the encoder could not have added it during the encoding process; hence the encoded symbol b(1) was MPS. Having the cognizance of b(1) is MPS, the decoder updates the value T just as the encoder did in preparation for decoding symbol b(2).

If C(s) is equal to or larger than TA, then b(1) was LPS, and TA has the value of augend A[b(1)]. This must be the case because the augend is "0" for MPS and the code has the property that the sum of relatively shifted augends to the right of the non-zero augend A[b(1)] for the remainder of the code string cannot exceed the magnitude A[b(1)]. If b(1) was LPS, the augend A[b(1)] is subtracted out from c(s). Also, C(s) − A[b(1)] is shifted left by the same amount k used in the encoding process after A[b(1)] was added. The shift aligns C[b(2) . . . b(n)] properly for the decoding of the next symbol, in this case b(2). Now the largest magnitude augend, if it is non-zero, is that due to b(2). Since magnitudes are being compared, the most significant or left end of the remaining code string is called the "working end" of said string. In the present encoder embodiment, this involves 16-bit precision. That is, the sixteen most significant bits of code string C(s) comprise the "working end" and are stored in register 54.

In FIG. 5 each cycle of decoder 47 performs the inverse function for a given symbol b(i) as compared with the operations of both encoder 5 and add and shift unit 8. Register 54 contains sixteen bits of the "working end" of the code string C(s) at the point for decoding symbol b(i). Register 55 contains the value of the 16-bit "retained fraction factor" from which the trial augend TA is calculated. In order to determine if the symbol b(i) was LPS, TA is subtracted from C and if the result is zero or more (positive), then the symbol b(i) was in fact LPS. If the result is negative, then TA is too large to have been used by the encoder and b(i) is the most probable symbol. However, before discussing the implementation of these decoding operations the carry-over problem must be resolved.

Decoder 47 receives a carry input over path 46 from the buffer and carry-over unit 43. The carry input is to be added to the least significant position of the value in register 54. As mentioned, this is the "working end" of the decoded code string. The required addition is provided by adder 92. The right input of adder 92 is the carry signal on path 46 while the left input is the 16-bit value of C applied over path 91. The output of adder 92 is parallel with fifteen bits being applied over path 81 through MUX 79 for parallel load into register 54, while the full carry adjusted sixteen bits is transferred over path 72 to the left input of binary adder 68. This left input serves as the minuend for a two's complement subtraction. The subtrahend is the trial augend located and emanating from TA binary adder 60 over 16-bit wide path 65 and applied to the right input of adder 68 through inverter 66. The value of the trial augend is calculated from the contents of register 55 and the value of skew parameter k utilizing barrel shifter 57 in the same way as described for the encoder. Now the value of register 55 is applied to the left input of adder 60. The right input of adder 60 is this same value of T, shifted right by unit 57 by an amount k applied over path 49. The right input is complemented by inverters 58 prior to application to the adder 60. The spill inverted input from barrel shifter 57 is inserted over a one-bit wide path 64 through inverter 59 over path 63.

The subtraction of the value TA from the carry adjusted value of C is executed by the two's complement addition where the value TA is complemented by inverter 66 and applied to the right input 67 of adder 68. Simultaneously, the carry-in input 70 of adder 68 receives the value "1". The sum output 69 of adder 68 represents the difference. The polarity of this 16-bit wide difference is indicated by the value on line 71. This is the one-bit carry output of adder 68. If the carry-out value is "1", the result is positive and the augend was indeed TA. This signifies that the encoded symbol b(i) was LPS. The carry-out line 71 is complemented by inverter 73 in order to generate the signal on path 74. The value of the decoded symbol b(i) appears as the output of exclusive-OR GATE 93 formed from the LPS value on path 50 and the value on path 74. Operations which prepare decoder 47 for the next cycle depend on the decode operation as represented by signals respectively on path 74 and 71. These are discussed separately.

If a decoded symbol was LPS, then updating T involves that the value of T remain the same. The input EN to register 55 over path 74 (WASMPS) should be "0". This is done by having the signal on path 74 connected to disable loading T except when the symbol is MPS.

LPS causes the value AMOUNT on path 45 from decoder 47 to carry over unit 43 to be the value of the parameter k received over path 49. This is accomplished through MUX 86 whose select control is determined by the carry-out signal from adder 68 over path 71. When this select control is "0", this causes the value on path 49 to be connected through to the output path 45. Further, when the symbol was LPS, the output from adder 68 on path 69 must be shifted left k places and returned to C. Simultaneously, the value of k is the number of lower order vacated positions of C which must be filled in from the data stream from path 44.

Significantly, register 54 must receive the new 16-bit "working end" of the code string. This is accomplished by the shifter appender 84.

The shifting and appending operation is performed by appender 84 under control of the integer value parameter k received over path 49. Appender 84 receives data inputs over paths 69 from adder 68 and the code string on path 44. Let AS[0−i] denote bit positions 0 through i of AS. The appender shifts TA left by k positions in order to form AS[0−(15-k)]

from the output bus 85. Positions

AS[(16−k)−15]

are filled by the left-most k bits appearing on paths 44. The 16-bit appender output on path 85 is applied to multiplexer 79 whose select control 77 is formed by the "anding" through gate 76 of the complemented carry output of adder 68 on path 74 and the complemented most significant bit of adder 60 output on path 65 through gate 93 and path 94. When the value on path 77 is a "0" and the symbol is LPS, the value on bus 85 is passed through MUX 79 to register 54. It is necessary that register 54 be enabled. This is attained by signal line 78. A 1 on path 71 through OR GATE 75 enables the register.

The shifter appender 84 has applied to it a 16-bit wide input V over path 44 from buffer and carry-over unit 43 representing the arithmetic code string. The other 16-bit wide input C(s)−A[b(i)]

is received over path 69 as the output from adder 68. The 16-bit wide appender output A is sent over path 85 to MUX 79. Lastly, the control is provided by the skew parameter k over path 49. The relations among the control inputs and outputs is depicted in the following table:

| | Shifter Appender Function Table | | | | | | |
|---|---|---|---|---|---|---|---|
| Control | A(0) | A(1) | ... | A(15-k) | A(16-k) | ... | A(14) | A(15) |
| 1 | C(1) | C(2) | | | | | C(15) | V(0) |
| 2 | C(2) | C(3) | | | | | V(0) | V(1) |
| k | C(k) | C(k-1) | ... | C(15) | V(0) | ... | V(k-2) | V(k-1) |

Shifter Appender Function Table -continued

| Control | A(0) | A(1) | ... | A(15-k) | A(16-k) | ... | A(14) | A(15) |
|---|---|---|---|---|---|---|---|---|
| 14 | C(14) | C(15) | | | | | V(12) | V(13) |

We have just described what happens when the symbol was LPS. Now suppose the decoded symbol was MPS, then it is necessary to update T, AMOUNT 45 and C54. In this sense, when a symbol is MPS, T is normalized in the same fashion as the encoder. MUX 89 behaves the same as MUX 36 of the encoder. If TA(0) is "1", then TA(0-15) is applied to bus 90 as data input to the T register 55. Otherwise, the sixteen bits of TA(1-15), 1 from path 88 would be applied to bus 90 with a "1" appended to the right to fill out the sixteen bits. The control of MUX 89 for steering either TA(0-15), or TA(1-15), 1 into register 55 is provided by the contents of a predetermined single bit position in the output of adder 60 at node 87. Note, that the enablement of register 55 is provided by a "1" (active value) appearing on path 74 to the EN input of register 55.

The value AMOUNT 45 must be determined. When MPS, the value AMOUNT 45 is "0" unless TA(0) is "0" and normalization is required. Therefore, when TA(0) is "0", the value on path 45 is 1, (0001) in binary, and 0 otherwise. Inverter 93 of the decoder performs the inversion of bit TA(0) in analogy to inverter 29 of the encoder. The AMOUNT value passes through AMUX 86 from source path 95.

When the symbol is MPS, register C 54 contents remain unchanged if normalization is not required, so the register enable path 78 is inactive. If normalization is required, register C 54 is shifted left one bit through MUX 79. When TA(0) is "0", TA is normalized, causing signal 94 as output of inverter 93, to be a "1" (active). Signal 94 activates the Enable input 78 of register C 54 through OR gate 75, and simultaneously activates select line 77 of MUX 79. The selected 16-bit input is thus bus 83, which is passed to data input bus 80 of register C 54. When shifting C left, the leftmost bit is shifted out and lost, and there must be a "fill" bit to enter the least significant bit position. The fill bit comes from the most significant bit of shifter appender input path 44. Accordingly, when normalization occurs, the C register positions 0–14 receive the 15-bit bus 81 which is the left-shifted value of the Carry Adjusted C bus 81, CAC (1-15), and C register position 15 receives the rightmost bit or 16th bit of bus 83 which is obtained from the most significant bit of bus 44, VLSTRING (0).

Referring now to FIG. 6, there is illustrated a first-order Markov-type state conditioning element. As is applied to transmitter 101, a source symbol applied over path 1 operates as a selector for determining a skew value and a LPS value to be sent to the binary encoding element 5 over respective paths 3 and 4. As applied to the receiver 105, the state conditioning element receives the last symbol decoded from decoder 47 over path 48 as a selector. The accessed k and LPS value is sent to decoder 47 over respective paths 49 and 50.

Referring now to FIG. 7, there is set forth an exemplary add and shift unit referenced in FIG. 2 code string manipulator 107. Here, the augend is added to the working end of the code string C to form the SUM. Since the shift amount SA received over path 4 is the number of bits of SUM, it is accepted by the carry-over unit as 16-bits wide on path 11. The carry-out of the sum operation is also transferred to the carry-over unit over path 9. This means that there are 16-SA remaining bits of SUM which are shifted left by the SA bits in the barrel shifter 205. The barrel shifter 205 output is deposited in register 201 over path 207 as the new "working end" of the code string. The shift amount SA is further distributed to units of the transmitter over path 6.

At this point in time consideration can finally be given to an illustrative example of decoder 47 action. Here a string C with appropriate p(0) and p(1) values is applied thereto. The five bits of the original symbol string are successively decoded in the following five cycles depicted in the example:

Decoder Example

Example decoding of C = 1100001, with p(0) = $\frac{3}{4}$ and p(1) = 14.
Align C = .1100001.

b(1)
    1. TA = (.1111 × .11) = .1011.
    3a. b(1) = 1
    3b. C = (.1100001 − .1011) × (2*2) = .01001.

b(2)
    1. TA = .1011
    2a. b(2) = 0.
    2b. T = .1011 b(3)
    1. TA = .1000
    2a. b(3) = 0.
    2b. T = .1000, C = .01001 b(4)
    1. TA = .0110
    2a. b(4) = 0
    2c. T = .1100
    2d. C = .1001 b(5)
    1. TA = .1001
    3a. b(5) = 1.
    3b. C = (.1001 − .1001) × (2*2) = 0
End of decoding of code string: s = 10001

There has been disclosed and described a method and means for the bit-by-bit encoding/decoding using probabilities conditioned upon a priori state information. The choice of skew intervals which cover the entropy curve permits implementation of FIFO arithmetic codes using only a single shift and subtract operation per encoding cycle. The utilization of the factors such as the parameter k, and the values $P_k(1)$, $l_k(LPS)$, and $l_k(MPS)$ implement an arithmetic binary code which avoids multiplication. In order to achieve a decodable code when extended to the state conditioning case, it is necessary to retain q bits of precision for all $l_k(LPS)$ and $l_k(MPS)$. It is the case that for any given technology the time to execute a multiply operation is approximately four times that of addition. Thus, the elimination of a one or more multiply operations in compression/-decompression should result in a data rate faster by one or more orders of magnitude.

It is to be understood that the particular embodiment of the invention described above and shown in the drawing is merely illustrative and not restrictive of the broad invention. For example, the invention should be of utility in the field of black/white image compression where the state of the art is represented by the aforementioned Preuss and Arps, et al, U.S. Pat. No. 4,028,731, issued June 7, 1977. Reference may also be made to Arnold, et al, U.S. Pat. No. 4,099,257 as an example of Markov encoding from context.

We claim:

1. In an apparatus for generating an instantaneous FIFO binary arithmetic code string C(sb) recursively formed by the high-to-low order pairwise combining of digits of a decodable set of relatively shifted finite binary number strings C(s), A(sb) responsive to each binary symbol b in the symbol string s; q of the lowest order bits of each string being combined during each recursion, wherein the improvement comprises:

a first (201 FIG. 7) and second (17 FIG. 3) register means for storing respectively at least q of the lowest order bits of C(s) and a number string T(s);

first means (2,3 FIG. 2; FIG. 6) responsive to each applied symbol b for obtaining an integer valued parameter k indicative of its relative frequency;

second means (FIG. 3) responsive to each symbol b and parameter k for forming A(sb), T(sb) such that:

$$T(sb) \text{ or } A(sb) = T(s)[1 - 2^{-k}]$$

third means (3,39,31,24) for forming a code string shift amount (SA) either of magnitude k when b is a first-bit value (b(1)=1) or of a second magnitude according to the value in a designated bit position (msb) in the second register; and fourth means (6,7,203,205,207) responsive to the shift amount and A(sb) for combining A(sb) with C(s) in the first register (201) to form C(sb) and for left shifting (6,205) the first register contents according to the shift amount.

2. In an apparatus according to claim 1, wherein the second means include:

means (3,18,19) for right-shifting a copy of the second register (17) contents by k positions;

means (18,20-28) for subtracting the shifted copied contents $T(s) 2^{-k}$ from the unshifted second register contents.

3. In the second means according to claim 2, wherein:

the means for right-shifting the second register contents includes:

a barrel shifter (19) having a right-hand spill output (20), an input adapted to receive n bits in parallel from the second register (17); a shift controller; and an n bit parallel output means (22);

the means for subtracting the shifted contents from the unshifted contents of the second register include:

a binary adder (26) having a first n bit parallel input from the second register; and means (23, 24) for complementing the output from the barrel shifter and applying said complemented output as a second input to the binary adder;

said means for forming a shift amount includes:

a circuit (39) coupling the first means output and a predetermined value source (29,54,38), the circuit selecting the first means output or the value source according to whether the symbol b is the least or most probable (31).

4. In an apparatus according to claim 1, wherein the apparatus further comprises:

means (12) for detecting the presence of n consecutive characters of a first kind (1's) in the code string C(sb) after each recursive string formation interval; and means responsive to the detection of n characters of the first kind for increasing the combined string length by at least one position and for inserting a control character therein.

5. In an apparatus according to claim 1, wherein said first means (FIG. 6) includes:

memory means for storing the least probable symbol identity and the counterpart integer parameter k and the most probable symbol identity and the counterpart integer parameter k at distinct locations; and means for accessing the least or most probable symbol identity and associated parameter k values responsive to the binary symbol value b applied thereto.

6. In the fourth means according to claim 1, wherein:

the means for combining A(sb) with C(s) in the first register (201) includes:

an adder (203) having a discrete sum (11) and carry (9) outputs;

the means for left shifting the first register contents includes:

a barrel shifter (205) coupling the sum output from the adder and left shifting responsive to the shift amount control (6) applied thereto.

7. In an apparatus for reconstructing a binary symbol string s=b(1) b(2)...b(i)...b(n) from an instantaneous FIFO binary arithmetic code C, wherein the improvement comprises:

a first (54 FIG. 5) and a second (55 FIG. 5) register means for storing respective at least q of the lowest order bits of C and a number string T;

first means (48-51 FIG. 4, FIG. 6) responsive to each decoded symbol b(i) for obtaining an integer valued parameter k indicative of its relative frequency of occurrence;

second means (FIG. 5) for forming a test augend (TA) yielding:

$$TA = T[1 - 2^{-k}];$$

third means (54,46,92) for carry modifying the contents of the second register;

fourth means (65-72) for generating the sign and magnitude difference between the trial augend TA and the carry modified second register contents C;

fifth means (50,79,93) for generating the symbol b(i) as having a first binary value (0) if TA>C and for generating b(i) having a second binary value (1) if TA≦C; and sixth means for updating the contents of the first and second registers according as to whether either TA≦C or TA>C.

8. In an apparatus according to claim 7, wherein the second means include:

means (16,49,57) for right-shifting a copy of the second register contents by k positions; and means (56,58,60) for subtracting the shifted copied contents from the unshifted second register contents.

9. In an apparatus according to claim 7, wherein said first means (FIG. 6) includes:

memory means for storing the least probable symbol identity and the counterpart integer parameter k, and the most probable symbol identity and the counterpart integer parameter k at distinct locations; and means for accessing the least or most probable symbol identity and associated parameter k responsive to the binary symbol value b applied thereto.

10. In an apparatus according to claim 7, wherein the sixth means for updating the contents of the first and second registers includes:

means (84) for shifting the difference output from the fourth means (68,69) k positions to the left and appending the left-most k bits from the code string applied to the apparatus;

means (79) for selectively inserting the output of the third means (92) or the shifted and appended string form insertion into the first register according as to the value of the symbol decoded.

11. In an apparatus according to claims 1 or 7, wherein the integer valued parameter k is inversely proportional to the relative frequency of occurrence of the least probable symbol in a binary source alphabet.

* * * * *